(12) United States Patent
Satoh et al.

(10) Patent No.: US 6,724,363 B1
(45) Date of Patent: Apr. 20, 2004

(54) TWO-WAY SHIFT REGISTER AND IMAGE DISPLAY DEVICE USING THE SAME

(75) Inventors: Masakazu Satoh, Tenri (JP); Yasushi Kubota, Sakurai (JP); Hajime Washio, Tenri (JP); Kazuhiro Maeda, Tenri (JP); Michael James Brownlow, Oxford (GB); Graham Andrew Cairns, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/568,889

(22) Filed: May 11, 2000

(30) Foreign Application Priority Data

May 14, 1999 (JP) ............................................. 11-134664

(51) Int. Cl.⁷ ................................................ G09G 3/36
(52) U.S. Cl. ......................................... 345/100; 345/98
(58) Field of Search ........................... 345/100, 98, 99, 345/92, 90, 87, 88, 204; 327/94, 108, 295; 377/54, 69, 70, 75

(56) References Cited

U.S. PATENT DOCUMENTS

| 4,048,673 | A | * | 9/1977 | Hendrie et al. | ............. 710/305 |
| 5,381,063 | A | | 1/1995 | Erhart et al. | ................. 327/288 |
| 5,717,351 | A | | 2/1998 | Katsutani | ..................... 327/108 |
| 5,781,171 | A | | 7/1998 | Kihara et al. | .................. 345/93 |
| 6,229,513 | B1 | * | 5/2001 | Nakano et al. | ............. 345/100 |
| 6,392,628 | B1 | * | 5/2002 | Yamazaki et al. | ............. 345/98 |

FOREIGN PATENT DOCUMENTS

| JP | 07-146462 | 6/1995 |
| JP | 09-062232 | 3/1997 |
| JP | 10-96958 | 4/1998 |

OTHER PUBLICATIONS

S. Steiner, et al.*SID 88 Digest*, High–Performance Column Driver for Gray–scale TFEL Displays, pp. 31–34.

A. Erhart, *SID 92 Digest*, 256–Gray–Level Column Drivers: A Review of Two IC Architectures, pp. 793–797.

* cited by examiner

*Primary Examiner*—Chanh Nguyen
(74) *Attorney, Agent, or Firm*—David G. Conlin; David A. Tucker; Edwards & Angell, LLP

(57) ABSTRACT

A shift register is provided with a shift register section composed of a plurality of stages of flip-flops that operate in synchronization with a clock signal, and level shifters for boosting a start signal lower than a driving voltage and for applying the same to both ends of the shift register section, and the shift register is capable of switching the shift direction in accordance with the switching signal. The foregoing level shifters are current-driving-type level shifters that can operate even in the case where the transistor characteristics are inferior or in the case of fast operations, and that can carry out level shifting even with a start signal having a small amplitude. Furthermore, the foregoing level shifters are provided at both ends of the shift register section, respectively, and one of the same stops operating in accordance with a switching signal, so that consumed power should decrease. Consequently, there can be provided a shift register that is capable of shifting in two directions, that can normally operate even with an input signal having a small amplitude, and that therefore consumes less electric power.

36 Claims, 9 Drawing Sheets

TWO-WAY SHIFT REGISTER AND IMAGE DISPLAY DEVICE USING THE SAME

FIELD OF THE INVENTION

The present invention relates to two-way shift register that is capable of two-way shifting of an input signal even in the case where an amplitude of an input signal is smaller than that of a driving voltage, so as to be advantageously used in, for instance, a driving circuit in an image display device. Further, the present invention also relates to an image display device using the same.

BACKGROUND OF THE INVENTION

Shift registers are widely used in, for instance, data signal driving circuits and scanning signal driving circuits in image display devices, so as to take timings for sampling data signals from image signals, and to produce a scanning signal to be applied to each signal line. Furthermore, in image display devices in which display sections or imaging sections are provided so as to be turned around, mirror images obtained by vertically or horizontally inverting images need be displayed depending on directions of the display section or the imaging section. Therefore two-way shift registers are used as the foregoing shift registers in the foregoing devices. In this case, upon switching of the shift direction, a direction for scanning images is inverted. Consequently, mirror images can be displayed without recording image signals in pixels.

On the other hand, consumed electric power of an electronic circuit increases proportionally to a product of a frequency, a load capacitance, and a square of a voltage. Therefore, in a circuit connected with an image display device, for instance, a circuit for producing image signals for an image display device, or in an image display device, a driving voltage tends to be set further lower so that the power consumption should be suppressed.

In circuits using polycrystalline silicon thin film transistors so as to ensure a large display area, for instance, in pixels, in data signal line driving circuits, or in scanning signal line driving circuits, differences in threshold voltages between substrates or in one and the same substrate are occasionally as much as several volts. Therefore, it cannot be considered that sufficient decrease in the driving voltage has been achieved. However, the driving voltage in a circuit using monocrystalline silicon transistors such as the foregoing image signal generating circuit are often set to 5V, or 3.3V, or lower than that. For this reason, in the case where input signals lower than the driving voltage of the shift register are applied, the shift register is provided with a level shifter for boosting the voltage of the input signal.

More specifically, in the case where a start signal SP with an amplitude of about 5V is applied to a conventional shift register 101 as described above, as shown in FIG. 9, for example, a level shifter 103 boosts the start signal SP to a level of a driving voltage (15V) of the shift register 101. An output of the level shifter 103 is applied to both a flip-flop $F_1$ on one end of a shift register section 102 and a flip-flop $F_n$ on the other end of the same. The shift register section 102 shifts the start signal SP in a direction corresponding to a switching signal L/R, in synchronization with a clock signal CK.

In the foregoing conventional shift register 101, however, the start signal SP is transferred to the flip-flops $F_1$ and $F_n$ after being level-shifted, and therefore, the following problem arises: as the distance between the flip-flops $F_1$ and $F_n$ increases, the transmission distance increases, and hence, the consumed power increases.

More specifically, as the transmission distance increases, the capacitance of the transmission-use signal line increases, thereby requiring a greater driving power of the level shifter 103, and hence, causing the consumed electric power to increase. Furthermore, in the case where the driving power of the level shifter 103 is in sufficient as in the case where the foregoing driving circuit including the level shifter 103 is formed using polycrystalline silicon thin film transistors, a buffer 104 is required to be provided between the level shifter 103 the flip-flop $F_n$, as shown with dotted lines in the figure, so that a non-distorted waveform is transferred. Consequently, further more electric power is consumed.

Recently, the number of stages in the shift register section 102 increases more and more, since a higher-resolution image display device with a larger display screen is in demand. Therefore, a two-way shift register and an image display device that does consume rather less electric power even when the distance between the flip-flops $F_1$ and $F_n$ on the both ends increases have been demanded earnestly.

SUMMARY OF THE INVENTION

An object of the present invention is to provide a shift register that is capable of two-way shifting, that normally operates even in the case where an input signal has a small amplitude, and that consumes less electric power, as well as to provide an image display device using such a shift register.

To achieve the foregoing object, a two-way shift register of the present invention is characterized by including (1) a shift register section for switching an input side to an output side or vice versa in accordance with a switching signal, and for transferring an input signal through a plurality of flip-flops from an end that has become an input-side end to an end that has become an output-side end, and (2) level shifters for boosting a signal and for outputting the same to the shift register section, the level shifters being provided adjacent to both the ends of the shift register section, respectively.

According to the foregoing arrangement, in the shift register section, the input signal is transferred through the plural flip-flops from the input side to the output side. The input side and the output side of the shift register section are switched to each other in accordance with the switching signal.

Incidentally, in a conventional two-way shift register, a shift register section is composed of a plurality of flip-flops, and a single level shifter for boosting a signal is provided adjacent to one end of the foregoing shift register section. Therefore, in the case where the other end becomes the input side according to a switching signal, the signal boosted by the level shifter is first transferred to the other end before being inputted to the shift register section.

The foregoing conventional arrangement however has the following problem.

Namely, recently an image display device of higher resolution has been demanded, that requires more and more flip-flops, thereby resulting in that a distance between both ends of a shift register section tends to increase. In this case, in the foregoing conventional arrangement in which the signal boosted by a level shifter at one end of the shift register is first transferred to the other end and then inputted, the level shifter requires a greater driving power as the transfer distance increases, and consequently the power consumption increases.

Furthermore, in the case where the driving power of the level shifter is not sufficient, it is necessary to provide a buffer on a route of transfer of the boosted signal, thereby causing further more electric power to be consumed.

Conversely, with the foregoing arrangement of the present invention, the level shifters for boosting a signal and for outputting the same to the shift register section are provided adjacent to both ends of the shift register section, respectively. Therefore, no matter which end of the shift register section becomes the input-side end according to the switching signal, the signal boosted by the level shifter adjacent to the input-side end can be outputted to the shift register section.

Thus, according to the present invention, the boosted signal need not be transferred from one end of the shift register to the other end thereof. Therefore, the consumed electric power does not increase, in the case where the distance between the ends of the shift register increases. Further, since to provide a buffer as in the conventional case is unnecessary, the foregoing arrangement of the present invention ensures to achieve a decrease in consumed power.

An image display device of the present invention is characterized by including (1) a plurality of pixels formed at intersections of a plurality of data signal lines and a plurality of scanning signal lines, (2) a data signal line driving circuit for consecutively driving the data signal lines, and (3) a scanning signal line driving circuit for consecutively driving the scanning signal lines, wherein at least one of the data signal line driving circuit and the scanning signal line driving circuit includes a shift register circuit, the shift register circuit including (i) a shift register section for switching an input side to an output side or vice versa in accordance with a switching signal, and for transferring an input signal through a plurality of flip-flops from an end that has become an input-side end to an end that has become an output-side end, and (ii) level shifters for boosting a signal and for outputting the same to the shift register, the level shifters being provided adjacent to both the ends of the shift register, respectively.

With the foregoing arrangement, in at least one of the two-way shift registers of the data signal line driving circuit and the scanning signal line driving circuit, the level shifters for boosting a signal and for outputting the same to the shift register section are provided adjacent to both the ends of the shift register section, respectively. Therefore, the boosted signal need not be transferred from one end of the shift register to the other end thereof. Consequently, the consumed electric power does not increase, in the case where the distance between the ends of the shift register increases. Further, since to provide a buffer as in the conventional case is unnecessary, the foregoing arrangement of the present invention ensures to achieve a decrease in consumed power.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

Figure 1:
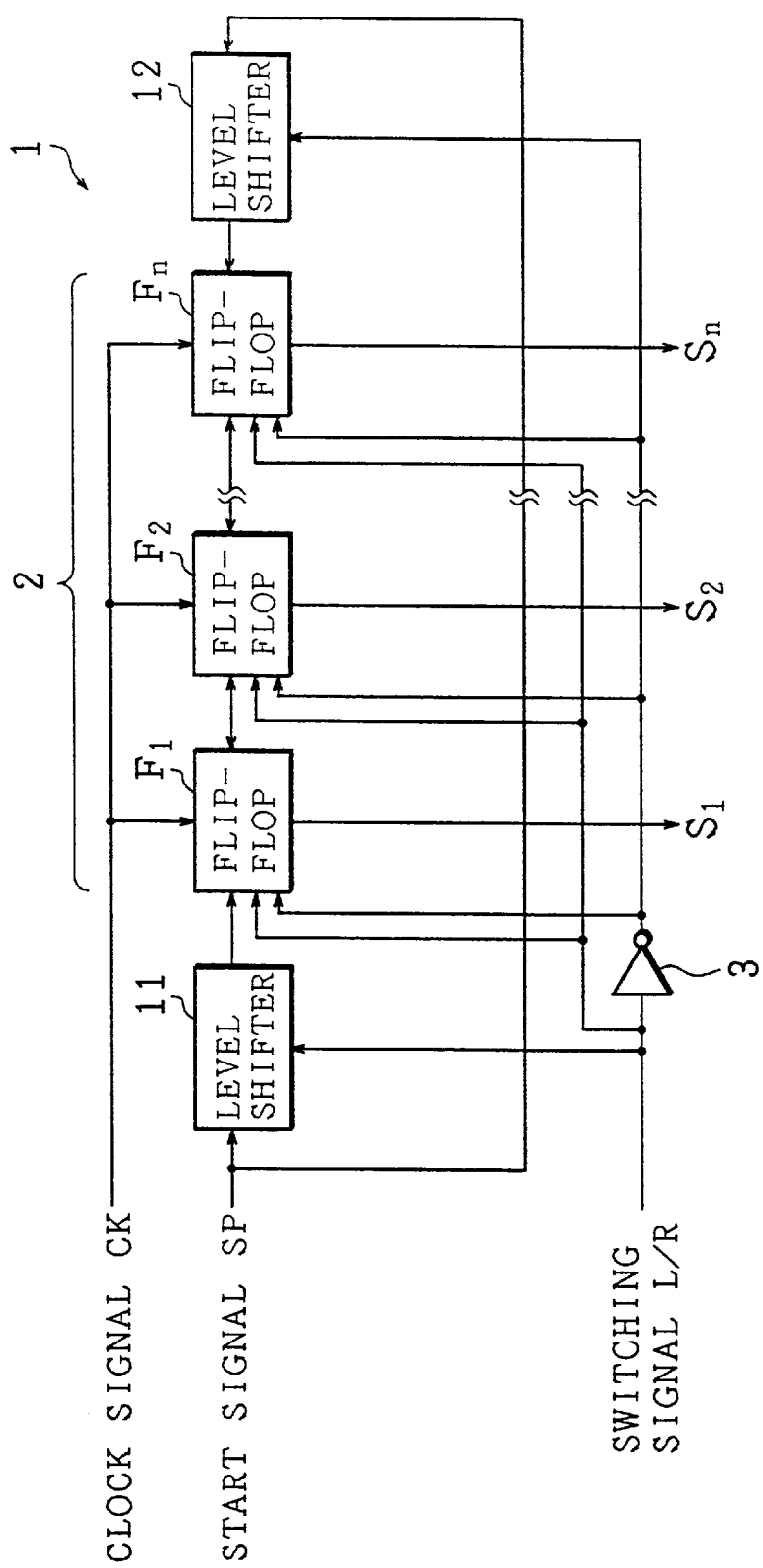
FIG. 1 is a block diagram illustrating an arrangement of a principal part of a two-way shift register in accordance with an embodiment of the present invention.
Figure 2:
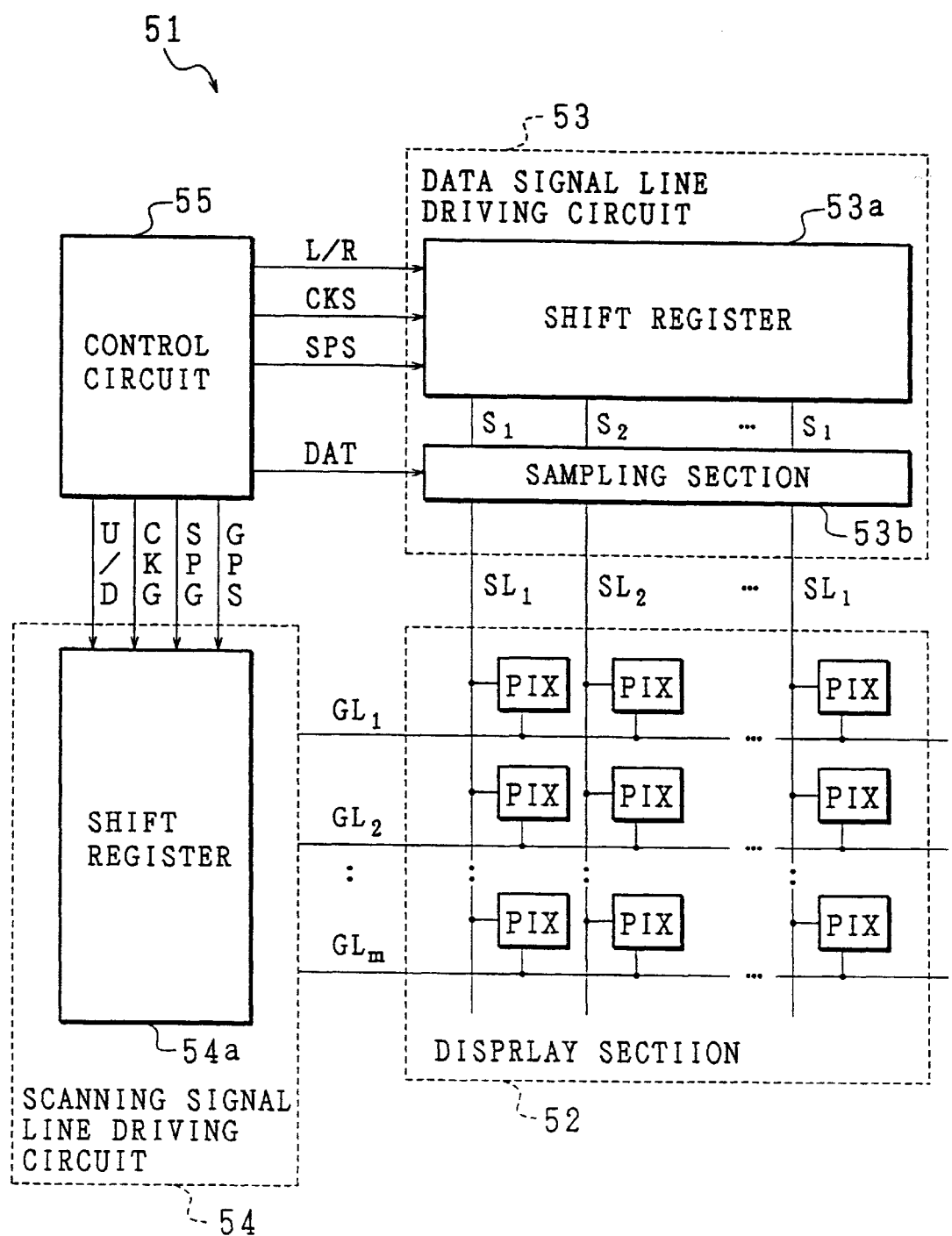
FIG. 2 is a block diagram illustrating a principal part of an image display device using the foregoing two-way shift register.
Figure 3:
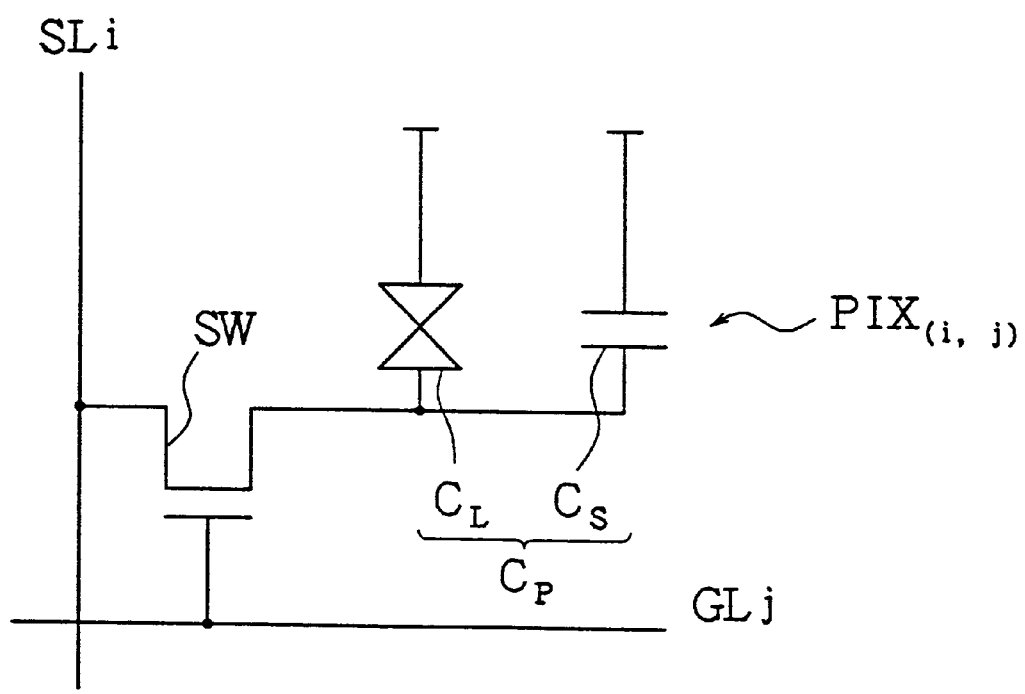
FIG. 3 is a circuit diagram illustrating a typical arrangement of a pixel in the foregoing image display device.

The following description will explain an embodiment of the present invention while referring to FIGS. 1 through 3. Incidentally, the present invention is widely applicable to shift registers capable of shifting in two directions, but the following description will be given by way of example with reference to an image display device to which the present invention is applied, as a preferred example.

More specifically, as shown in FIG. 2, an image display device 51 in accordance with the present embodiment is provided with a display section 52 including pixels PIX arrayed in matrix, and a data signal line driving circuit 53 and a scanning signal line driving circuit 54 for driving the pixels PIX, so that, when a control circuit 55 generates image signals DAT each indicating a display state of each pixel PIX, the image display device 51 thus arranged is capable of displaying an image in accordance with the image signals DAT.

The foregoing display section 52 and both the driving circuits 53 and 54 are provided on one and the same substrate for simplification of the fabricating process and for a decrease in wire capacitances. Further, the foregoing display section 52 and both the driving circuits 53 and 54 are composed of polycrystalline silicon thin film transistors formed on a glass substrate, with view to integration of more pixels PIX and enlargement of a display area. Furthermore, the foregoing polycrystalline silicon thin film transistors are formed at a processing temperature of not higher than 600° C. This intends to ensure that, even in the case where a normal glass substrate (having a deformation point of not higher than 600° C.), warp and flexure that tend to occur due to a process at a temperature higher than the deformation point should not occur.

Here, the foregoing display section 52 is provided with l data signal lines $SL_1$ through $SL_l$, and m scanning signal lines $GL_1$ through $GL_m$ crossing the data signal lines $SL_1$ through $SL_l$. Let a positive integer not greater than l be i, while let a positive integer not greater than m be j, and every combination of the data signal line $SL_i$ and the scanning signal line $GL_j$ has a corresponding pixel $PIX_{(i,j)}$. Each pixel $PIX_{(i,j)}$ is disposed in an area defined by two adjacent data signal lines $SL_i$ and $SL_{i+1}$ and two adjacent scanning signal lines $GL_j$ and $GL_{j+1}$.

Each of the foregoing pixels $PIX_{(i,j)}$ is provided with, as shown in FIG. 3, for example, a field-effect transistor (switching element) SW whose gate and drain are connected with the scanning signal line $GL_j$ and the data signal line $SL_i$, respectively, as well as a pixel capacitor $C_P$ one of whose electrodes is connected with the source of the field-effect transistor. The other electrode of the pixel capacitor $C_P$ is connected with a common electrode line to which all the pixels PIX are commonly connected. The foregoing pixel capacitor $C_P$ is composed of a liquid crystal capacitor $C_L$ and a supplemental capacitor $C_S$ that is added when necessary.

In the foregoing pixel $PIX_{(i,j)}$, upon selection of the scanning signal line $GL_j$, the field-effect transistor SW provides conduction, thereby allowing a voltage applied to the data signal line $SL_i$ to be applied to a pixel capacitor $C_P$. On the other hand, while the field-effect transistor SW is cut off after the end of the selection period of the foregoing scanning signal line $GL_j$, the pixel capacitor $C_P$ remains to keep a voltage at a time when the field-effect transistor SW becomes cut off. Here, a transmissivity and a reflectance of liquid crystal varies with a voltage applied to the liquid crystal capacitor $C_L$. Therefore, by selecting the scanning signal line $GL_j$ and by applying to the data signal line $SL_i$ a voltage in accordance with the image signal, the display state of the foregoing pixel $PIX_{(i,j)}$ can be changed in accordance with the image data.

In the image display device shown in FIG. 2, the scanning signal line driving circuit 54 selects the scanning signal line GL, and image data for a pixel PIX corresponding to a combination of the selected scanning signal line GL and each of the data signal lines SL are outputted to each of the data signal lines SL by the data signal line driving circuit 53. In so doing, the image data are written into the pixels PIX connected to the foregoing scanning signal line GL. Further, the scanning signal line driving circuit 54 consecutively selects the scanning signal lines GL, and the data signal line driving circuit 53 outputs image data to each of the data signal lines SL. Consequently, every pixel PIX in the display section 52 becomes in a state in which corresponding image data are written therein.

Here, from the control circuit 55 to the data signal line driving circuit 53, the image data for each pixel PIX are transferred as image signals DAT by time division, and the data signal line driving circuit 53 extracts the image data from the image signals DAT at timings by a clock signal CKS with a predetermined frequency serving as a timing signal and a start signal SPS.

Concretely, the foregoing data signal line driving circuit 53 includes a shift register 53a and a shift register 53b. The shift register 53a shifts the start signal SPS in synchronization with the clock signal CKS in a shift direction indicated by the switching signal L/R so as to generate output signals $S_1$ through $S_l$ that differ in timing by one clock for each. The shift register 53b samples the image signals DAT at timings indicated by the output signals $S_i$ through $S_l$, and extracts from the image signals DAT the image data to be outputted to the respective data signal lines $SL_1$ through $S_l$. Here, as will be described later, when the switching signal L/R indicates shift in the rightward direction (a direction from $S_1$ to $S_l$), the output signal $S_1$ is outputted at the earliest timing. When the switching signal L/R indicates shift in the leftward direction, the output signal $S_l$ is outputted at the earliest timing. Therefore, by switching the switching signal L/R, the order in which the image data to the data signal lines $S_1$ through $S_l$ are extracted from the image signals DAT can be changed, so that a mirrored image can be displayed on the display section 52.

Likewise, the scanning signal line driving circuit 54 shifts the start signal SPG in a shift direction indicated by a switching signal U/D in synchronization with the clock signal CKG so as to generate scanning signals that differ in timing by one clock for each and to output the same to the scanning signal lines $GL_1$ through $GL_m$, respectively. Accordingly, when the switching signal U/D indicates shift in the downward direction (from $GL_1$ to $GL_m$), the output signal supplied to the scanning signal line $GL_1$ is outputted at the earliest timing. On the other hand, when the switching signal U/D indicates shift in the upward direction (from $GL_1$ to $GL_m$), the output signal supplied to the scanning signal line $GL_m$ is outputted at the earliest timing. Thus, by switching the switching signal U/D, the order in which the scanning signal lines $GL_1$ through $GL_m$ are selected one by one can be changed, so that an inverted image can be displayed on the display section 52.

Here, in the image display device 51 in accordance with the present embodiment, the display section 52 and the driving circuits 53 and 54 are composed of polycrystalline silicon thin film transistors. The driving voltage $V_{CC}$ for the display section 52 and the driving circuits 53 and 54 is set to, for instance, about 15V. On the other hand, the control circuit 55 is provided on a substrate different from that having the display section 52 and the driving circuits 53 and 54 thereon, and is formed with polycrystalline silicon transistors. The driving voltage for the control circuit 55 is set to, for instance, about 5V or lower than that, that is lower than the foregoing driving voltage $V_{CC}$. Incidentally, the display section 52 and the driving circuit 53 and 54 on one hand and the control circuit 55 on the other hand are provided on different substrates, and the number of kinds of signals transferred therebetween is greatly smaller than the number of kinds of signals transferred between the display section 52 and the driving circuits 53 and 54, since they are, for example, the image signals DAT, the start signals SPS (SPG), the clock signal CKS (CKG), and the switching signal L/R (U/D) and the like. Further, the control circuit 55 can easily ensure sufficient driving power, since it is composed of monocrystalline silicon transistors. Therefore, even in the case where they are provided on different substrates, increases in the steps of the fabrication process, in the wire capacitances, and in the consumed power are suppressed to levels that they would not adversely affect.

Here, in the present embodiment, at least one of the shift registers 53a and 54a is a shift register 1 shown in FIG. 1. Note that in the following description, the foregoing start signal SPS (SPG) and the switching signal L/R (U/D) are referred to as SP and L/R, respectively, so that the description can be applicable irrelevant to the cases. Besides, the number l(m) of the stages of the shift register 1 is referred to as n, and the output signals therefrom are referred as output signals $S_1$ through $S_n$.

More concretely, the foregoing shift register 1 is composed of a plurality of flip-flops $F_1$ through $F_n$, and includes a shift register 2 capable of shifting in two directions in synchronization with the clock signal CK. The shift register 2 in accordance with the present embodiment determines the shift direction based on the switching signal L/R itself and a signal obtained by inverting the switching signal L/R by an inverter 3. When the switching signal L/R indicates a rightward-direction shift or downward-direction shift (regular-direction shift), the shift register section 2 transfers the start signal SP from the flip-flop $F_1$ at the left end or the upper end to the flip-flop $F_n$ at the right end or the lower end. On the other hand, when the switching signal L/R indicates leftward-direction shift or an upward-direction shift (opposite-direction shift), the shift register section 2 transfers the start signal SP from the flip-flop $F_n$ to the flip-flop $F_1$.

As described above, the driving voltage of the control circuit 55 is set lower than the driving voltage $V_{CC}$ of the shift register 1, and the amplitude of the start signal SP is also set smaller than the driving voltage $V_{CC}$. Therefore, the foregoing shift register 1 further includes level shifters 11 and 12 for boosting the start signal SP and applying the same to the shift register section 2.

In the present embodiment, the level shifters 11 and 12 are provided at ends of the shift register section 2. The level shifter 11 at the left (or upper) end boosts the start signal SP and outputs the same to the foregoing flip-flop $F_1$, while the level shifter 12 at the right (or lower) end boosts the start signal SP and outputs the same to the foregoing flip-flop $F_n$. Furthermore, the foregoing level shifters 11 and 12 arranged so that, according to the switching signal L/R, only one of them operates. When the switching signal L/R indicates regular-direction shift, only the level shifter 11 on the input side operates. On the other hand, when the switching signal L/R indicates opposite-direction shift, only the level shifter 12 operates, while the level shifter 11 stops operating. Incidentally, the foregoing level shifters 11 and 12 correspond to control means and level shifters described in claims.

In the foregoing arrangement, in the case where the switching signal L/R indicates regular-direction shift, the level shifter 11 boosts the start signal SP, and supplies the same to the flip-flop $F_1$. On the other hand, each of the flip-flops $F_1$ receives the output signal from the previous stage, that is, from the circuit adjacent thereto on the left (or upper) side, and outputs the same at the timings by the clock signal CK to the next stage, that is, to the circuit adjacent thereto on the right (or lower) side. In so doing, the start signal SP is transferred in the regular direction every clock, and the flip-flops $F_1$ through $F_n$ output the output signals $S_1$ through $S_n$ at timings of one clock behind the timings of the output signals of the circuits adjacent thereto on the left (or upper) side, that is, the level shifter 11 and the flip-flops $F_1$ through $F_{(n-1)}$, respectively. In this state, the level shifter 12 stops operating according to the inverted signal $\overline{L/R}$.

Contrary to this, in the case where the switching signal L/R indicates opposite-direction shift, the level shifter 11 stops operating, while the level shifter 12 starts operating. In this state, upon application of the start signal SP, the level shifter 12 boosts the start signal SP and supplies the same to the flip-flop $F_n$. Each of the flip-flops $F_n$ through $F_1$ receives the output signal from the circuit adjacent thereto on the right (or lower) side, and outputs the signal to the circuit adjacent thereto on the left (or upper) side, in synchronization with the clock signal CK. In so doing, the start signal SP is transferred in the opposite direction every clock, and the flip-flops $F_n$ through $F_1$ output the output signals $S_n$ through $S_1$ at timings of one clock behind the timings of the output signals of the circuits adjacent thereto on the right (or lower) side, that is, the level shifter 12 and the flip-flops $F_n$ through $F_2$, respectively.

As described above, the shift register 1 includes the shift register section 2 and the level shifters 11 and 12. The shift register section 2 switches the input side to the output side or vice versa in accordance with the switching signal L/R, and transfers an input signal from an end on a side that has become the input side to an end on a side that has become the output side through the plurality of flip-flops $F_1$ through $F_n$. Further, the foregoing level shifters 11 and 12 are disposed adjacent to the ends on the both sides of the shift register section 2 so as to boost a signal and to output the same to the shift register section 2.

In the foregoing arrangement, the level shifters 11 and 12 are provided at the both ends of the shift register section 2, respectively. Therefore, as compared with the case where an output signal of a level shifter disposed at one end of the shift register section is transferred to both the ends of the same, the distance between the level shifter 11 and the flip-flop $F_1$ and the distance between the level shifter 12 and the flip-flop $F_n$ can be set shorter, thereby ensuring a drastic decrease in the load capacitance of each of the level shifters 11 and 12. Besides, since the start signal SP itself is transferred to the level shifter 11 (12) and thereafter it is boosted, the amplitude of the signal transferred between the both ends of the shift register section 2 is smaller as compared with the case where the start signal after being subjected to level shifting is transferred. Consequently, the flip-flops $F_1$ ($F_n$) can be driven without a buffer circuit, thereby ensuring suppression of the power consumption of the shift register 1 even in, for example, the following case: the level shifter 11 (12) has a low driving power and the shift register section 2 has many stages, like in the case where the level shifter 11 (12) is formed with polycrystalline silicon thin film transistors.

Furthermore, in the present embodiment, among the level shifters 11 and 12, only either one on the input side of the shift register section 2 according to the shift direction is caused to operate, while the other one on the output side thereof according to the same is stopped. Consequently, the power consumption of the shift register 1 can be further suppressed, as compared with the case where both the level shifter 11 and 12 concurrently operate.

Here, in the case where the amplitude of the start signal SP is smaller than the threshold value of the transistor at the input stage, the level shifter of the voltage driving type that turns on/off according to the start signal SP becomes inoperable. Therefore, as the level shifters 11 and 12, level shifters of a current driving type are used. The level shifters of the current driving type are operable in the case where transistor characteristic are inferior or in the case where fast driving is required, whereas the power consumption is greater as compared with that of the level shifter of the voltage driving type since electric current flows at all times during operation. Therefore, in the case where the level shifters of the current driving type are used, either one of the level shifters 11 and 12 is preferably stopped, as in the present embodiment.

Incidentally, even in the case where the level shifters of the voltage driving type are used, either one of the level shifters 11 and 12 is preferably stopped, since electric power is consumed at least when an output varies.

[Second Embodiment]

Figure 4:
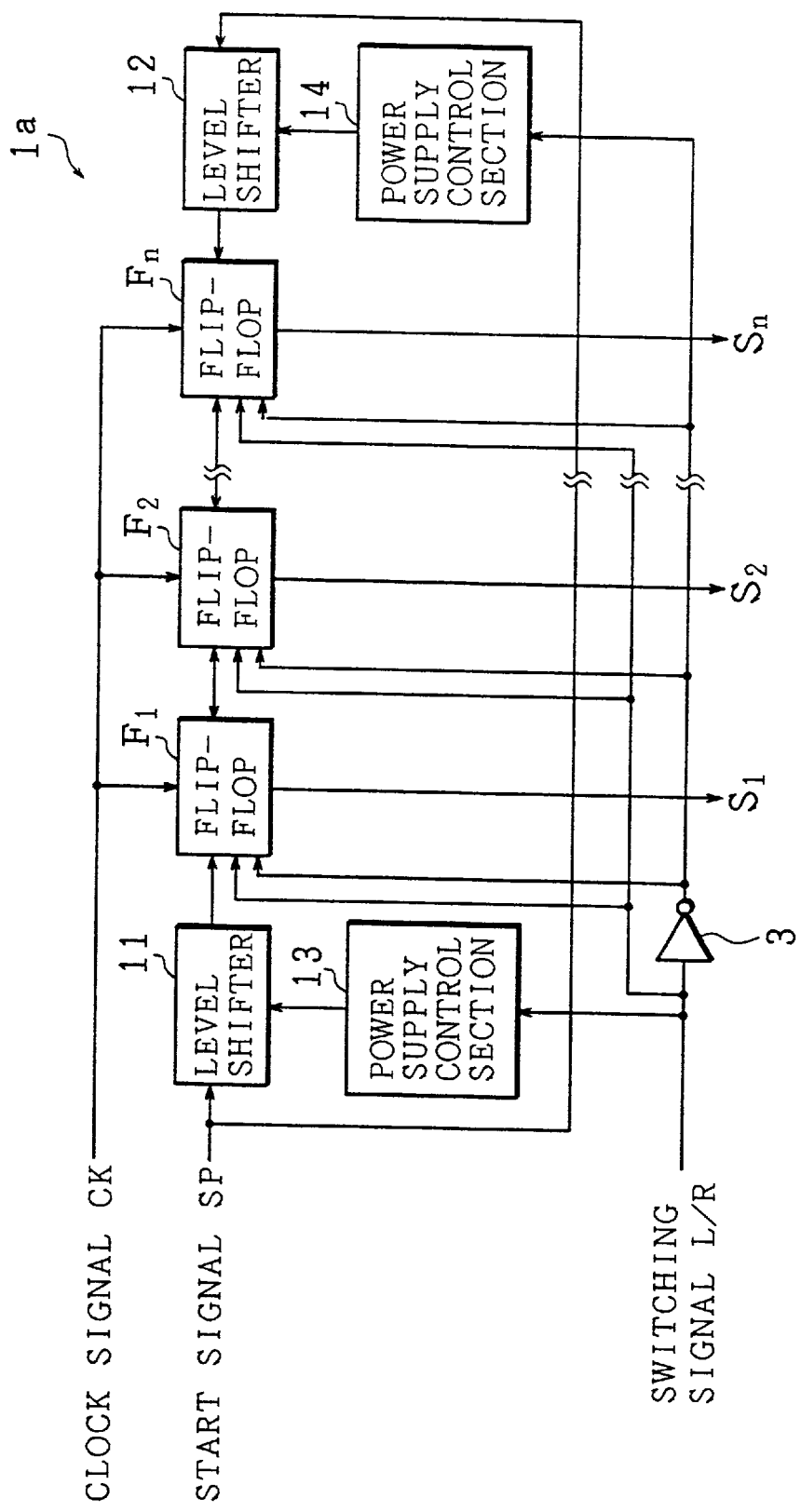
FIG. 4 is a block diagram illustrating an arrangement of a principal part of a two-way shift register in accordance with another embodiment of the present invention.

The following description will be given by way of example with reference to the case where power supply to the level shifter 11 (12) is stopped, as a method for stopping the operation of the foregoing level shifter 11 (12). More specifically, a shift register 1a in accordance with the present embodiment is provided with a power supply control section 13 for controlling power supply to the level shifter 11 and a power supply control section 14 for controlling power supply to the level shifter 12, as shown in FIG. 4. Incidentally, the power supply control sections 13 and 14 in the present embodiment correspond to control means recited in claims, and the level shifters 11 and 12 in the present embodiment correspond to level shift sections recited in claims.

The foregoing power supply control section 13 supplies power to the level shifter 11 only when the switching signal L/R indicates the regular-direction shift, and stops the power supply when the signal indicates the opposite-direction shift, so as to stop the level shifter 11. Likewise, the power supply control section 14 supplies power to the level shifter 12 only when the switching signal L/R indicates the opposite-direction shift.

According to the foregoing arrangement, power is supplied to each of the level shifters 11 and 12 only when operating. Therefore, the level shifter 11 or 12 that stops operating, power is not consumed, thereby resulting in suppression of power consumption in the shift register 1.
[Third Embodiment]

A range of an input voltage that allows the level shifter 11 (12) to operate (input dynamic range), however, is determined depending on the circuit arrangement and the driving voltage $V_{CC}$. Accordingly, it is possible to stop the level shifter 11 (12) by applying an input signal outside the foregoing input dynamic range to the level shifter 11 (12).

Figure 5:
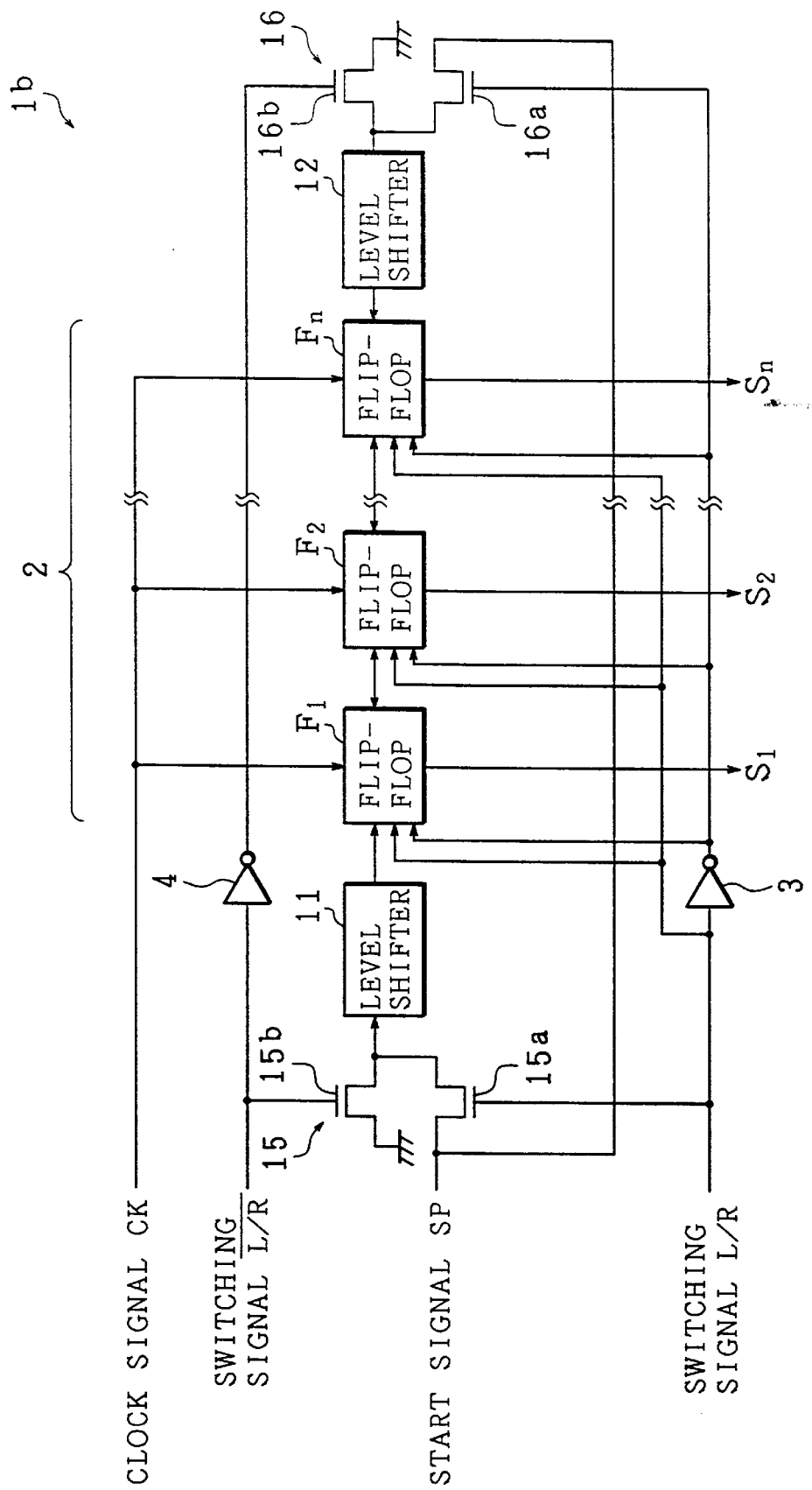
FIG. 5 is a block diagram illustrating an arrangement of a principal part of a two-way shift register in accordance with still another embodiment of the present invention.

The following description will explain a case where the foregoing input dynamic range does not cover a ground level, while referring to FIG. 5, as an example of a case where the level shifter 11 (12) is stopped by controlling the signal level inputted to the level shifter 11 (12).

More specifically, a shift register 1b in accordance with the present embodiment is provided with (1) an input switching circuit 15 for selecting either the start signal SP or the ground level and for supplying the selected one to the level shifter 11, and (2) an input switching circuit 16 for selecting either one of them and for supplying the selected one to the level shifter 12. The input switching circuit 15 includes a MOS transistor 15a and a MOS transistor 15b. An end of the MOS transistor 15a is supplied with the start signal SP while the other end thereof is connected with an input terminal of the level shifter 11, and the MOS transistor 15a provides conduction when the switching signal L/R indicates the regular-direction shift. The MOS transistor 15b is provided between an input terminal of the level shifter 11 and a terminal of the ground level, and provides conduction when the switching signal L/R indicates the opposite-direction shift. Likewise, the input switching circuit 16 includes an N-type MOS transistor 16a and a MOS transistor 16b. The N-type MOS transistor 16a provides conduction when the switching signal L/R indicates the opposite-direction shift, so as to apply the start signal SP to the level shifter 12. The MOS transistor 16b causes the input terminal of the level shifter 12 to be grounded.

Incidentally, the input switching circuits 15 and 16 correspond to the control means recited in claims, while the level shifters 11 and 12 correspond to the level shift sections.

In the foregoing embodiment, the MOS transistors 15a through 16b are N-type, and let the switching signal L/R having a high level indicate the regular-direction shift. In such a case, the switching signal L/R is applied to the gate of the transistor 15a, while an output signal of the inverter 3 is applied to a gate of the MOS transistor 16a. The inverted signal $\overline{L/R}$ is applied to a gate of the MOS transistor 15b, while a signal obtained by inversion of the inverted signal $\overline{L/R}$ by the inverter 4 is applied to a gate of the MOS transistor 16b.

According to the foregoing arrangement, in the case where the switching signal L/R indicates the regular-direction shift, the level shifter 11 is supplied with the start signal SP, while the input terminal of the level shifter 12 is grounded. Here, since the input dynamic range of the level shifter 12 does not cover the ground level, the level shifter 12 is stopped. This allows only the level shifter 11 to operate. Conversely, in the case where the switching signal L/R indicates the opposite-direction shift, an input outside the input dynamic range of the level shifter 11 is applied to the level shifter 11, thereby causing only the level shifter 12 to operate.

Incidentally, the voltage outputted by the input switching circuit 15 (16) upon suspension of the level shifter 11 (12) may be a voltage outside the input dynamic range of the level shifter 11 (12). As described later, however, in the case where the level shifter 11 (12) is the current driving type, the voltage is preferably set to the voltage that causes the transistor at the input stage of the level shifter 11 (12) to be cut off, that is, the voltage that causes short circuit current not to flow. This is because the power consumption due to the short circuit current can be suppressed, thereby realizing a low-power-consuming shift register 1b.

[Fourth Embodiment]

Incidentally, in the foregoing first through third embodiments, the level shifter 11 (12) is directly connected with the flip-flop $F_1$ ($F_n$). Therefore, the output signal of the level shifter 11 (12) becomes unstable upon stop of an operation, thereby possibly causing malfunction of the flip-flop $F_1$ ($F_n$).

Figure 6:
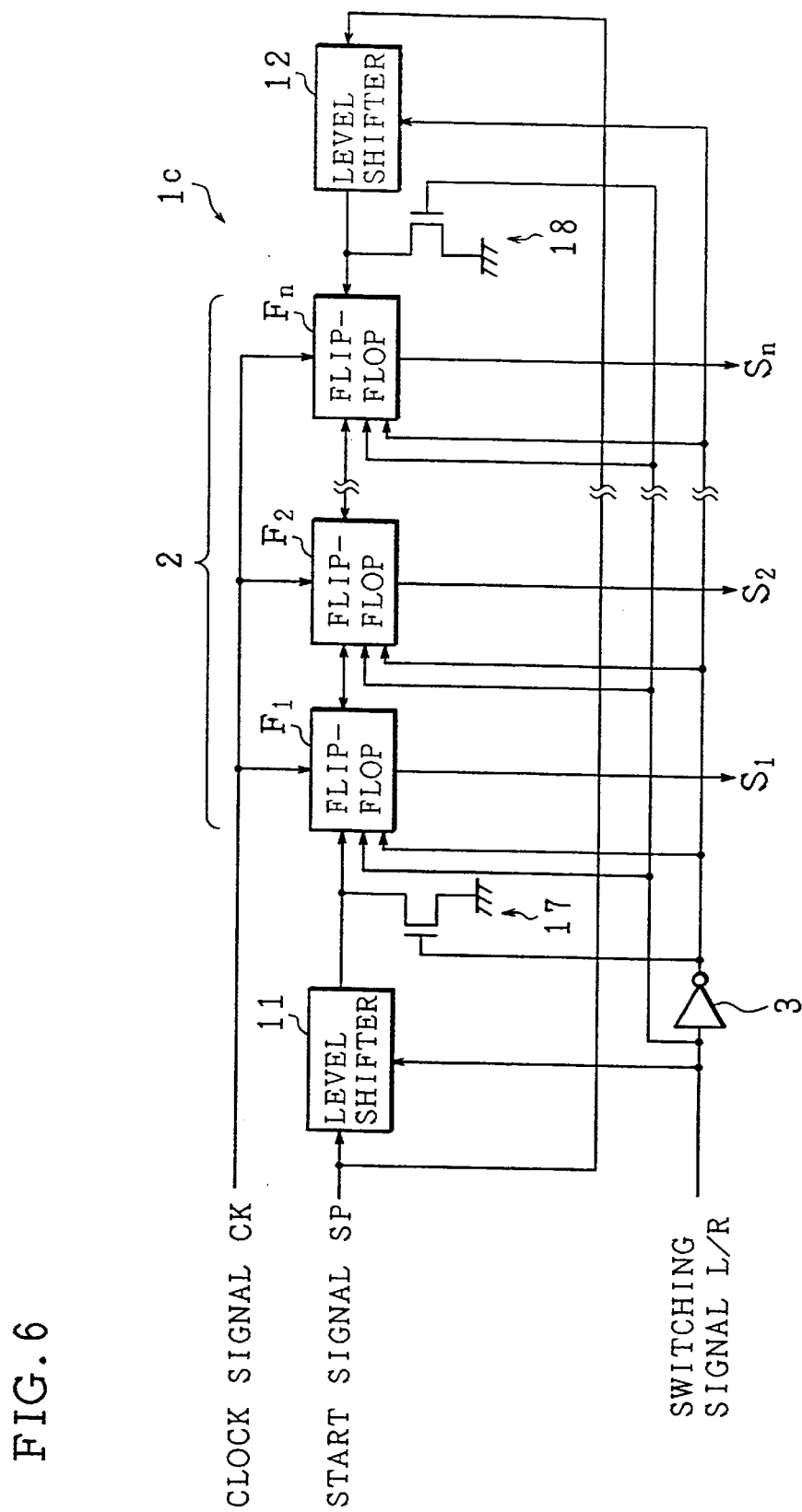
FIG. 6 is a block diagram illustrating an arrangement of a principal part of a two-way shift register in accordance with still another embodiment of the present invention.

On the other hand, a shift register 1c in accordance with the present embodiment is provided with an output stabilizing circuit (output stabilizing means) 17 (18) for stabilizing an output voltage upon stop of an operation, as shown in FIG. 6. Incidentally, any shift register 1 (1a, 1b, or 1c) may be provided with the output stabilizing circuit 17 (18), but the following description will be given by way of example with reference to the case where it is provided in the shift register 1 shown in FIG. 1.

More specifically, the output stabilizing circuit 17 in accordance with the present embodiment is provided between the output of the level shifter 11 and the ground level, and is composed of an N-type MOS transistor that provides conduction when the switching signal L/R applied to its gate indicates the opposite-direction shift. Likewise, the output stabilizing circuit 18 is composed of the N-type MOS transistor that is provided between the output of the level shifter 12 and the ground level and that provides conduction when the switching signal L/R indicates the regular-direction shift. Incidentally, in this example, the switching signal L/R indicates the regular-direction shift when the switching signal L/R is at the high level, and at such a moment, the output signal of the inverter 3 is applied to the gate of the MOS transistor in the output stabilizing circuit 17, while the switching signal L/R is applied to the gate of the MOS transistor in the output stabilizing circuit 18.

According to the foregoing arrangement, the MOS transistor of the output stabilizing circuit 17 (18) provides conduction when the level shifter 11 (12) does not operate, thereby causing the output of the level shifter 11 (12) to fall to the ground level. Consequently, unlike in the case where the output voltage of the level shifter 11 (12) is unstable, this prevents the malfunction of the flip-flop $F_1$ ($F_n$) connected with the level shifter 11 (12), and allows realization of the shift register 1c that is more stable.

[Fifth Embodiment]

Figure 7:
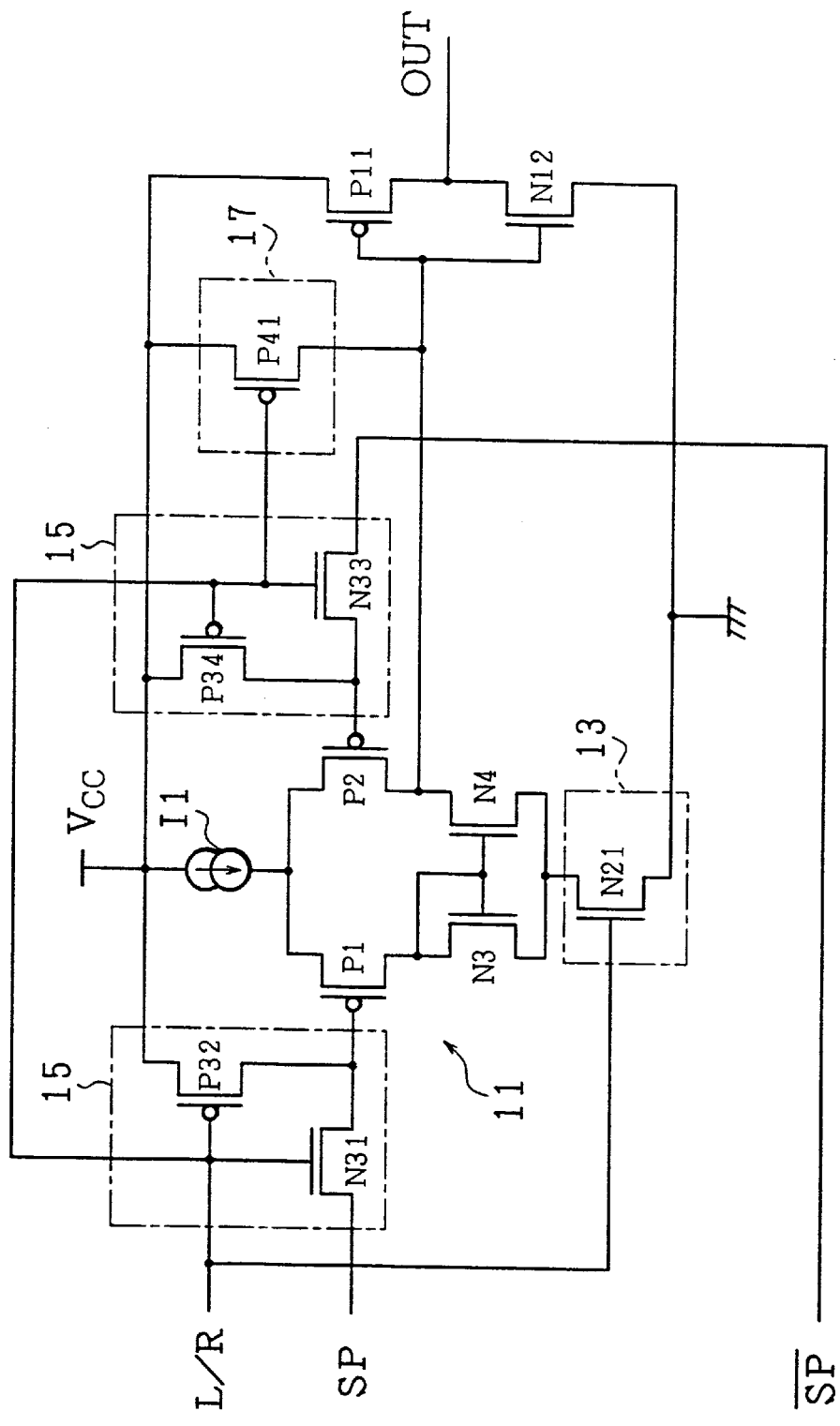
FIG. 7 is a circuit diagram illustrating a typical arrangement of a level shifter in the foregoing two-way level shifter.

The following description will explain, as another embodiment of the present invention, a concrete arrangement of the foregoing shift register 1 (1a, 1b, or 1c) in the case where it is provided with all of the foregoing current-driving-type level shifter 11 (12), the foregoing power supply control section 13 (14), the foregoing input switching circuit 15 (16), and the foregoing output stabilizing circuit 17 (18), while referring to the circuit diagram of FIG. 7. Incidentally, the figure shows only members (11, 13, 15, and 17) associated with the level shifter 11.

More specifically, a level shifter 11 in accordance with the present embodiment is a current-driving-type level shifter, and is provided with P-type MOS transistors P1 and P2 whose sources are connected with each other, a constant current source I1 for supplying a predetermined current to the sources of the transistors P1 and P2, N-type MOS transistors N3 and N4 composing a current mirror circuit and serving as active loads to the transistors P1 and P2, and CMOS transistors P11 and N12 for amplifying an output based on a pair of difference inputs.

The start signal SP is supplied to a gate of the foregoing transistor P1 via a transistor N31 that will be described later, while an inverted signal $\overline{SP}$ of the start signal SP is supplied to a gate of the transistor P2 via a transistor N33 that will be described later. Further, gates of the transistors N3 and N4 are connected with each other, and a node connecting the gates of the transistors N3 and N4 is further connected to drains of the foregoing transistors P1 and N3. On the other hand, drains of the transistors P2 and N4 are connected with each other, and a node connecting the drains of the transistors P2 and N4 is further connected with gates of the foregoing transistors P11 and N12. The sources of the transistors N3 and N4 are grounded via the N-type MOS transistor N21 serving as the foregoing power supply control section 13.

On the other hand, the input switching circuit 15 includes an N-type MOS transistor N31 provided on a route of supply of the start signal SP to the gate of the foregoing transistor P1, and a P-type MOS transistor P32 provided on a route of supply of the driving voltage Vcc to the gate of the transistor P1. Likewise, the gate of the transistor P2 is supplied with the inverted signal $\overline{SP}$ of the start signal SP via the transistor N33, and the driving voltage Vcc via a transistor P34.

Furthermore, the output stabilizing circuit 17 in accordance with the present embodiment is arranged so as to stabilize the output voltage of the level shifter 11 to the driving voltage Vcc during stop of an operation of the level shifter 11. Accordingly, a P-type MOS transistor P41 is provided on a route for supply of the driving voltage Vcc to the gates of the foregoing transistors P11 and N12.

In the present embodiment, the switching signal L/R is set so as to indicates the regular-direction shift and to cause the level shifter 11 to operate when it is at the high level. Therefore, the switching signal L/R is applied to the respective gates of the transistors N21 through P41.

In the foregoing arrangement, when the switching signal L/R indicates the regular-direction shift (when it is at the high level), the transistors N21, N31, and N33 provide conduction, and the transistors P32, P34, and P41 become cut off. In this state, the current from the constant current source I1 flows through the transistors P1 and N3 or the transistors P2 and N4, and thereafter, through the transistor N21. To the gates of the transistors P1 and P2, the start signal SP and the inverted signal $\overline{SP}$ of the start signal SP are applied, respectively. Consequently, voltages corresponding to gate-source voltage ratios are applied to the transistors P1 and P2. On the other hand, since the transistors N3 and N4 function as active loads, the voltage at the node connecting the transistors P2 and N4 becomes a voltage according to a difference between voltage levels of the signals SP and $\overline{SP}$. This voltage becomes the gate voltages of the CMOS transistors P11 and N12, and is outputted as an output voltage OUT after being amplified at the transistors P11 and N12.

The foregoing level shifter 11 is a current-driving-type level shifter in which the transistors P1 and P2 at the input stage provide conduction always while the level shifter is operating, unlike the arrangement in which the states of the transistors P1 and P2 at the input stage are switched between conduction and cut-off, that is, the voltage driving type. Accordingly, the current from the constant current source I1 is divided according to the gate-source voltage ratio of the transistors P1 and P2, so that the start signal SP is subjected to level shift. This enables the level shift of the start signal SP without difficulties, even in the case where the amplitude of the start signal SP is smaller than those of the threshold values of the transistors P1 and P2 at the input stage.

Figure 8:
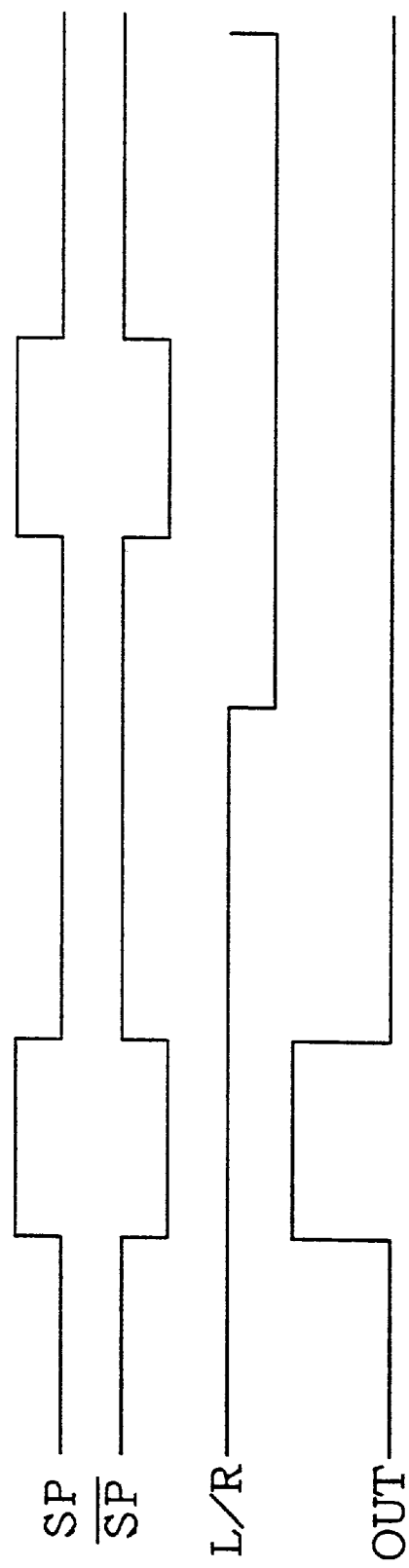
FIG. 8 is a waveform chart illustrating an operation of the foregoing level shifter.
Figure 9:
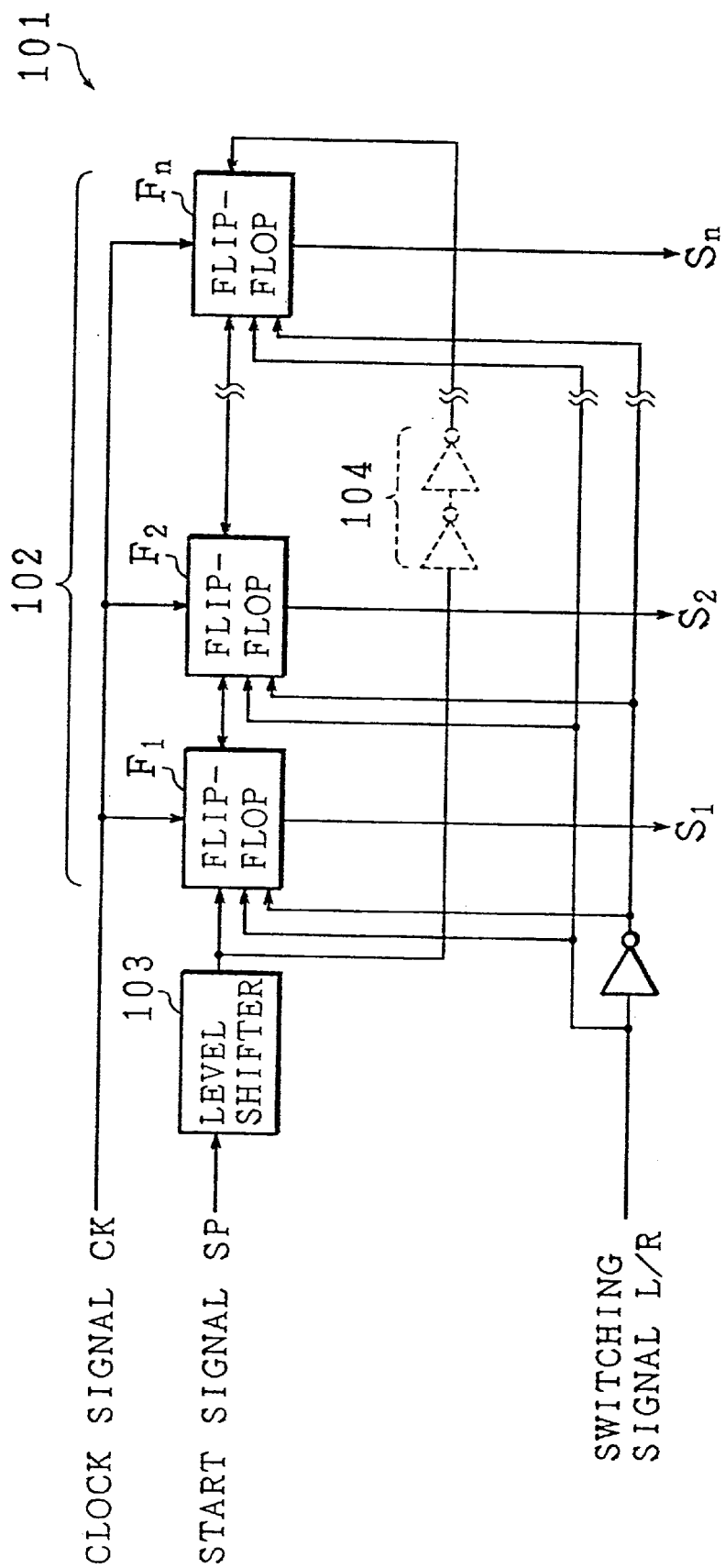
FIG. 9 is a block diagram illustrating an arrangement of a principal part of a prior-art two-way shift register.

Consequently, as shown in FIG. 8, the level shifter 11 becomes able to output an output voltage OUT that has the same wave-form as that of the start signal SP having a peak value (for instance, about 5V) lower than the driving voltage Vcc, and that has a peak value boosted to the driving voltage Vcc level (for instance, about 15V), while the switching signal L/R is at the high level.

Conversely, when the switching signal L/R indicates the opposite-direction shift (when at the low level), the current flowing from the constant current source I1 through the transistors P1 and N3, or the transistors P2 and N4 is blocked by the transistor N21. In this state, since the current supply from the constant current source I1 is blocked by the transistor N21, consumed power due to the foregoing current flow can be reduced. Further, in this state, current is not supplied to the transistors P1 and P2, thereby preventing the transistors P1 and P2 from functioning as a pair of difference inputs. Accordingly, the potential at the output end, that is, the node connecting the transistors P2 and N4 cannot be determined.

Furthermore, in this state, the transistors N31 and N33 in the input switching circuit 15 are cut off, while the transistors P32 and P34 conduct. This causes both the gate voltages of the transistors P1 and P2 to become the driving voltage Vcc, thereby causing the transistors P1 and P2 to be cut off. Consequently, like in the case where the transistor N21 is cut off, consumed power can be decreased by the quantity of current outputted by the constant current source I1. Further, in this state, the transistors P1 and P2 cannot function as a pair of difference inputs. Therefore, the potential at the output end cannot be determined.

Additionally, when the switching signal L/R indicates the opposite-direction shift, the transistor P41 of the output stabilizing circuit 17 provides conduction. This causes the foregoing output end, that is, the gate potentials of the transistors P11 and N12, to become the driving voltage Vcc, thereby causing the output voltage OUT to become at the low level. As a result, as shown in FIG. 8, the output voltage OUT of the level shifter 11 is kept at the low level irrelevant to the start signal SP when the switching signal L/R indicates the opposite-direction shift.

Here, though the members associated with the level shifter 11 are shown in FIG. 7, the members (12, 14, 16, and 18) associated with the level shifter 12 are arranged so that the inverted signal $\overline{L/R}$, for example, the output signal of the inverter 3, is applied in the place of the switching signal L/R. The figure illustrates an example of an arrangement in which all the power supply control section 13, the input switching circuit 15, and the output stabilizing circuit 17 are provided, but to omit the power supply control section 13 (14), the transistor N21 may be omitted while the sources of the transistors N3 and N4 may be grounded. To omit the input switching circuit 15 (16), the transistors N31, P32, N33, and P34 may be omitted so that the start signal SP may be applied directly to the gate of the transistor P1, while the inverted signal $\overline{SP}$ of the start signal SP may be applied to the gate of the transistor P2. Further, by omitting the transistor P41, a level shifter in which the output stabilizing circuit 17 (18) is omitted can be realized.

As described above, an image display device 51 of the present invention includes (1) a plurality of pixels PIX formed at intersections of a plurality of data signal lines $SL_1$ through $SL_l$ and a plurality of scanning signal lines $GL_1$ through $GL_m$, (2) a data signal line driving circuit 53 for consecutively driving the data signal lines $SL_1$ through $SL_l$, and (3) a scanning signal line driving circuit 54 for consecutively driving the scanning signal lines $GL_1$ through $GL_m$. At least one of the data signal line driving circuit 53 and the scanning signal line driving circuit 54 includes a two-way shift register 1 shown in FIG. 1 or 7 (or any one of the shift registers 1a, 1b, and 1c that are shown in FIGS. 4, 5, and 6, respectively).

Incidentally, the descriptions of the foregoing first through fifth embodiments are given by way of example with reference to an image display device to which the shift register is applied, but the two-way shift register of the present invention can be widely applied as long as it is applied in a device which requires two-way shifting and in which an input signal has an amplitude smaller than that of a driving voltage of a shift register. In an image display device, however, since improvement of the resolution and enlargement of a display area are earnestly demanded, it is likely that a shift register has a large number of stages thereby making it impossible to ensure sufficient driving power of the level shifter. Therefore, application of the present invention to a driving circuit of such an image display device is particularly effective.

As described above, a two-way shift register in accordance with the present invention includes a plurality of flip-flops that operate in synchronization with a clock signal, that is capable of switching a shift direction to either of two directions in accordance with a switching signal, and that is supplied with an input signal having an amplitude smaller than that of a driving voltage, and the two-way shift register may be arranged so as to include level shifters for boosting the input signal, the level shifters being provided on both ends of the flip-flops, respectively.

According to the foregoing arrangement, in the case where the shift direction is designated so as to be one direction (first direction), an input signal is boosted by a level shifter (first level shifter) provided on one end side (first end) of the plurality of stages of flipflops, and thereafter it is applied to the flip-flop at the first end, so as to be transferred in synchronization with the foregoing clock signal. To the contrary, in the case where the shift direction is designated so as to be the opposite direction (second direction) to the first direction, the input signal is boosted by a level shifter (second level shifter) provided on an opposite end side to the first end of the plurality of stages of flip-flops, and thereafter it is applied to the flip-flop at the second end, thereby being transferred in synchronization with the foregoing clock signal.

According to the foregoing arrangement, the first and second level shifters are provided at both the ends of the plurality of stages of flip-flops. Accordingly, as compared with the case where a single level shifter applies a level-shifted signal to the first and second ends of the flip-flops, the distance from the level shifter to the flip-flops can be shortened. This causes the distance of transfer of the level-shifted signal to be shortened, and accordingly causes the load capacitance of the level shifter to be reduced, thereby allowing the driving power of the level shifter to be reduced. Consequently, even in the case where the driving power for the level shifter is small while the distance to the flip-flops is long, a buffer need not be provided on a route from the level shifter to the flip-flops, and the consumed electric power of the two-way shift register can be reduced.

The two-way shift register arranged as above is preferably provided with control means for stopping, among the level shifters, the one on a rear side in the shift direction, in accordance with the switching signal.

According to the foregoing arrangement, the second level shifter stops operating while only the first level shifter operates when the switching signal indicates the first direction. On the other hand, when the switching signal indicates the second direction, the first level shifter stops operating while only the second level shifter operates. This allows one of the level shifters to stop operating without adversely affecting the shifting of the input signal by the two-way shift register. Consequently, the consumed electric power can be reduced as compared with the case where they both operate.

Furthermore, the foregoing two-way shift register is preferably arranged so that each of the level shifters includes a level shift section of a current driving type including an input switching element.

According to the foregoing arrangement, the input switching element of the level shifter always conducts as long as the level shifter operates. Therefore, unlike the level shifter of the voltage driving type that causes the input switching element to conduct/cut off according to a level of the input signal, the input signal can be level-shifted without any difficulty even in the case where an amplitude of the input signal is smaller than that of the threshold voltage of the input switching element.

Furthermore, since the input switching element provides conduction in the level shifter of the current driving type while operating, the level shifter consumes more electric power than the level shifter of the voltage driving type does, but one of the level shifters stops operating. For this reason, there can be provided the two-way shift register that is capable of level shifting in the case where an amplitude of the input signal is smaller than that of the threshold voltage of the input switching element, and that consumes less electric power as compared with two level shifters both operate concurrently.

Furthermore, in the two-way shift register arranged as above, the control means may stop the level shifter by applying, as an input signal to each level shift section, a signal at a level to cut off the input switching element.

According to the foregoing arrangement, giving as example a case where the input switching element is a MOS transistor, in the case where an input signal is applied to a gate thereof, the input switching element is cut off by applying to the gate an input signal at a level to cause the transistor to be cut off between a drain and a source thereof. In the case where an input signal is applied to the source, the input switching element is cut off by applying, for example, an input signal identical to that applied to the drain.

In any arrangement, by the control means controlling the level of the input signal so as to cut off the input switching element, the level shifter of the current driving type stops operating. This ensures that the control means can stops the level shifter, and that the consumed electric power can be decreased for the electric current that would have flown through the input switching element during stop of operations.

On the other hand, in the foregoing two-way shift register including the foregoing control means, the control means may stop power supply to each level shifter, so as to stop the level shifter.

According to the foregoing arrangement, the control means stops power supply to each level shifter, so as to stop the level shifter. This allows the control means to stop the level shifter, and ensures that the consumed electric power can be decreased for the electric power that would have been consumed by the level shifter during an operation.

Incidentally, in the case where the output voltage of the level shifter becomes unstable while the level shifter stops operating, the operation of the flip-flop connected with the level shifter is likely to become unstable.

Therefore, in the two-way level shifter arranged as above, each level shifter preferably includes output stabilizing means.

With the foregoing arrangement, the output voltage of the level shifter is kept to a predetermined value by the output stabilizing means while the level shifter stops operating. Consequently, malfunction of the flipflop due to the unstable output voltage can be prevented, thereby allowing a more stable two-way shift register to be realized.

On the other hand, an image display device in accordance with the present invention may be arranged so as to include (1) a plurality of pixels arrayed in matrix, (2) a plurality of data signal lines provided along rows of the pixels, respectively, (3) a plurality of scanning signal lines provided along columns of the pixels, respectively, (4) a scanning signal line driving circuit for applying scanning signals to the scanning signal lines one by one, respectively, at different timings in synchronization with a first clock signal (CKG) having a predetermined frequency, and (5) a data signal line driving circuit for extracting data signals to be applied to the pixels along the scanning signal lines to that the scanning signals are applied, from image signals that are consecutively applied in synchronization with a second clock signal having a predetermined frequency and that indicate display states of the pixels, respectively, and for outputting the extracted data signals to the data signal lines, respectively, wherein at least one of the data signal line driving circuit and the scanning signal line driving circuit includes a two-way shift register having any one of the aforementioned arrangements, that utilizes either the first clock signal or the second clock signal as a clock signal.

Here, in the image display device, the flip-flops for generating timings for signal lines increase in number as the data signal lines or the scanning signal lines increase in number, thereby causing the distance between the flip-flops at ends to become longer. In the two-way shift register having any one of the foregoing arrangements, however, even in the case where the level shifter has a small driving power while the distance between the flip-flops at the ends is long, a buffer need not be provided, thereby allowing a decrease in the consumed power. Furthermore, the foregoing image display device can supply the pixels with data for mirror images by inverting the scanning direction of the data signal line or the scanning signal line by means of the two-way shift register.

Therefore, by providing the two-way shift register having any one of the foregoing arrangements in at least one of the data signal line driving circuit and the scanning signal line driving circuit, display of mirror images is made possible, and an image display device consuming less electric power can be realized.

Furthermore, in the image display device arranged as above, the data signal line driving circuit, the scanning signal line driving circuit and the pixels are preferably provided on one and the same substrate.

According to the foregoing arrangement, the data signal line driving circuit, the scanning signal line driving circuit, and the pixels are provided on one and the same substrate. Therefore, wires between the data signal line driving circuit and the pixels, as well as wires between the scanning signal lines and the pixels are provided on the substrate, and need not be provided outside the substrate. Consequently, in the case where the data signal lines and the scanning signal lines increase in number, the number of signal lines provided outside the substrate does not change, thereby allowing the steps in assembling to be reduced. Furthermore, since terminals for connecting the signal lines with the outside of the substrate need not be provided, undesirable increase in capacitances of signal lines can be avoided, while the lowering of integration can be prevented.

Incidentally, use of polycrystalline silicon thin films allows a substrate with a greater area to be easily realized as compared with use of monocrystalline silicon, but on the other hand, polycrystalline silicon transistors are inferior in transistor characteristics such as mobility and threshold values as compared with those of monocrystalline silicon transistors. Therefore, in the case where circuits are formed with the monocrystalline silicon transistors, it is difficult to enlarge a surface area. On the other hand, in the case where circuits are formed with the polycrystalline silicon thin film transistors, driving performances of the circuits are impaired. Incidentally, in the case where the driving circuits and pixels are provided in different substrates, respectively, it is necessary to connect the substrates with signal lines, and this requires more steps in the fabricating process, and this causes capacitances of the signal lines to increase.

Therefore, in the image display device having any one of the foregoing arrangements, each of the data signal line driving circuit, the scanning signal line driving circuit, and the pixels preferably includes a switching element composed of a polycrystalline silicon thin film transistor.

With the foregoing arrangement in which each of the data signal line driving circuit, the scanning signal line driving circuit, and the pixels includes a switching element composed of a polycrystalline silicon thin film transistor, it is possible to easily enlarge a surface area. Furthermore, since they are easily formed on one and the same substrate, the number of steps in the fabricating process and the capacitances of signal lines can be reduced. Moreover, since the two-way shift register having any one of the foregoing arrangements, a level-shifted input signal can be applied to both ends of the flip-flops without difficulty, even in the case where the level shifter has a low driving power. Consequently, an image display device consuming less electric power and having a large surface area can be realized.

In addition, in the image display device having any one of the foregoing arrangements, each of the data signal line driving circuit, the scanning signal line driving circuit, and the pixels includes a switching element fabricated at a processing temperature of not higher than 600° C.

With the foregoing arrangement in which the processing temperature for fabricating the switching elements is set to not higher than 600° C., even in the case where a normal glass substrate (having a deformation point of not higher than 600° C.), warp and flexure that tend to occur due to a process at a temperature higher than the deformation point by no means occur. Consequently, an image display device fabricated through an easier process and having a larger area can be realized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-way shift register, comprising:
a shift register section for switching an input side end to an output side end or vice versa in accordance with a switching signal, and for transferring an input signal through a plurality of flip-flops from the end that has become an input-side end to the end that has become an output-side end; and level shifters provided respectively adjacent to said ends of said shift register section such that said level shifter adjacent said end that has become an input-side end of said shift register section boosts a received signal and outputs the same as said input signal to an input at said end that has become an input-side end of said shift register section, while said level shifter adjacent to said end that has become an output-side end of said shift register section is stopped from operating to provide a boosted received signal to an input at said end that has become an output-side end of said shift register section.

2. The two-way shift register as set forth in claim 1, further comprising:

an output stabilizing circuit for keeping constant an output voltage of said level shifter that is stopped from operating.

3. The two-way shift register as set forth in claim 1, further comprising:

a power supply control section for stopping power supply to said level shifter adjacent to said end of said shift register that has become said output-side end.

4. The two-way shift register as set forth in claim 1, further comprising:

an input switching circuit for changing a level of a signal such that a voltage is generated at a level that when applied to said level shifter adjacent to the end of said shift register section that has become the output-side end thereof causes that level shifter to stop operating, and for applying the voltage so generated to the level shifter adjacent to the end of said shift register section that has become the output-side end thereof.

5. The two-way shift register as set forth in claim 4, wherein:

each of said level shifters is a voltage-driving-type level shifter; and the generated voltage is a voltage outside of a range of an input voltage necessary to cause either of said level shifters to operate so as to boost a received signal and output the same as said input signal to an input at an end that has become an input-side end of said shift register section.

6. The two-way shift register as set forth in claim 4, wherein:

each of said level shifters is a current-driving-type level shifter having an input stage including a switching element; and the generated voltage is a voltage turns off said switching element.

7. A two-way shift register, that includes a plurality of flip-flops that operate in synchronization with a clock signal, that is capable of switching a shift direction to either of two directions in accordance with a switching signal, and that is supplied with an input signal having an amplitude smaller than that of a driving voltage, said two-way shift register comprising:

level shifters, each said level shifter being provided adjacent to and connected to an input at a different end of said flip-flops such that said level shifter adjacent to the end of said flip-flops supplied with said input signal boosts said input signal and outputs the same as said input signal to said flip-flops, while said level shifter not adjacent to the end of said flip-flops supplied with said input signal is stopped from operating to provide a boosted input signal to an input at the end of said flip-flops adjacent thereto.

8. The two-way shift register as set forth in claim 7, further comprising:

control means for stopping, among said level shifters, the one on the end of said plurality of flip-flops in the shift direction, in accordance with the switching signal.

9. The two-way shift register as set forth in claim 8, wherein each of said level shifters includes a level shift section of a current driving type including an input switching element.

10. The two-way shift register as set forth in claim 9, wherein said control means stops said level shifter adjacent to the rear end of the plurality of flip-flops in the shift direction by applying, as an input signal to that level shifter, a signal at a level to cut off input to the switching element of that level shifter.

11. The two-way level shifter as set forth in claim 8, wherein said control means stops power supply to the level shifter on the rear end of said plurality of flip-flops in the shift direction, in accordance with the switching signal, so as to stop that level shifter.

12. The two-way shift register as set forth in claim 8, wherein each level shifter includes output stabilizing means.

13. The two-way shift register as set forth in claim 12, wherein said output stabilizing means keeps an output voltage of the one of said level shifters being stopped to a predetermined value.

14. An image display device, comprising:

a plurality of pixels formed at intersections of a plurality of data signal lines and a plurality of scanning lines;

a data signal line driving circuit for consecutively driving said data signal lines, and a scanning signal line driving circuit for consecutively driving said scanning signal lines, wherein:

at least one of said data signal line driving circuit and said scanning signal line driving circuit includes a shift register circuit including:

a shift register section for switching an input side end to an output side end or vice versa in accordance with a switching signal, and for transferring an input signal through a plurality of flip-flops from the end that has become an input-side end to the end that has become an output-side end; and level shifters provided respectively adjacent to said ends of said shift register section such that said level shifter adjacent said end that has become an input-side end of said shift register section boosts a received signal and outputs the same as said input signal to an input at said end that has become an input-side end of said shift register section, while said level shifter adjacent to said end that has become an output-side end of said shift register section is stopped from operating to provide a boosted received signal to an input at said end that has become an output-side end of said shift register section.

15. The image display device as set forth in claim 14, further comprising:

an output stabilizing circuit for keeping constant an output voltage of said level shifter that is stopped from operating.

16. The image display device as set forth in claim 14, wherein said shift register circuit further includes a power supply control section for stopping power supply to said level shifter adjacent to said end of said shift register that has become said output-side end.

17. The image display device as set forth in claim 14, wherein said shift register circuit further includes an input switching circuit for changing a level of a signal such that a voltage is generated at a level that when applied to said level shifter adjacent to the end of said shift register section that has become the output-side end thereof causes that level shifter to stop operating, and for applying the voltage so generated to the level shifter adjacent to the end of said shift register section that has become the output-side end thereof.

18. The image display device as set forth in claim 17, wherein:
   each of said level shifters is a voltage-driving-type level shifter; and
   the generated voltage is a voltage outside of a range of an input voltage necessary to cause either of said level shifters to operate so as to boost a received signal and output the same as said input signal to an input at an end that has become an input-side end of said shift register section.

19. The image display device as set forth in claim 17, wherein:
   each of said level shifters is a current-driving-type level shifter having an input stage including a switching element; and
   the generated voltage is a voltage turns off a said switching element.

20. The image display device as set forth in claim 14, wherein said data signal driving circuit, said scanning signal line driving circuit, and said pixels are provided on the same substrate.

21. The image display device as set forth in claim 14, wherein each of said data signal line driving circuit, said scanning signal line driving circuit, and said pixels includes a switching element composed of a polycrystalline silicon thin film transistor.

22. An image display device, comprising:
   a plurality of pixels arrayed in a matrix;
   a plurality of data signal lines provided along rows of said pixels, respectively;
   a plurality of scanning signal lines provided along columns of said pixels, respectively;
   a scanning signal line driving circuit for applying scanning signals to said scanning signal lines one by one, respectively, at different timings in synchronization with a first clock signal having a predetermined frequency; and
   a data signal line driving circuit for extracting data signals to be applied to said pixels along said scanning signal lines to which the scanning signals are applied, from image signals that are consecutively applied in synchronization with a second clock signal having a predetermined frequency and that indicate display states of said pixels, respectively, and for outputting the extracted data signals to said data signal lines, respectively, wherein:
   at least one of the data signal line driving circuit and the scanning signal line driving circuit includes a two-way shift register that utilizes either the first clock signal or the second clock signal as a clock signal, that includes a plurality of flip-flops operating in synchronization with the clock signal, that is capable of switching a shift direction to either of two directions in accordance with a switching signal, and that is supplied with an input signal having an amplitude smaller than that of a driving voltage,
   wherein said two-way shift register further includes
      level shifters, each said level shifter being provided adjacent to and connected to an input at a different end of said flip-flops such that said level shifter adjacent to the end of said flip-flops supplied with said input signal boosts said input signal and outputs the same as said input signal to said flip-flops, while said level shifter not adjacent to the end of said flip-flops supplied with said input signal is stopped from operating to provide a boosted input signal to an input at the end of said flip-flops adjacent thereto.

23. The image display device as set forth in claim 22, wherein said data signal driving circuit, said scanning signal line driving circuit, and said pixels are provided on the same substrate.

24. The image display device as set forth in claim 22, wherein each of said data signal line driving circuit, said scanning signal line driving circuit, and said pixels includes a switching element composed of a polycrystalline silicon thin film transistor.

25. The image display device as set forth in claim 22, wherein each of said data signal line driving circuit, said scanning signal line driving circuit and said pixels includes a switching element fabricated at a processing temperature of not higher than 600° C.

26. A shift register comprising:
   a plurality of stages of flip-flops; and
   a first level shifter provided at one end of said plurality of stages of flip-flops and second level shifters provided at the other end of the plurality of stages of flip-flops, wherein:
      a shift direction is capable of being switched in both directions along said plurality of flip-flops according to a switching signal, and
      when the shift direction is designated so as to be a first direction, an input signal is boosted by the first level shifter provided at said one end of the plurality of stages of flip-flops so as to be applied to an input of a flip-flop at said one end and the second level shifter provided at said other end of the plurality of stages of flip-flops is stopped from operating to provide a boosted input signal to an input of a flip-flop at said other end, and
      when the shift direction is designated to be a second direction opposite to the first direction, an input signal is boosted by the second level shifter provided at said other end of the plurality of stages of flip-flops so as to be applied to an input of a flip-flop at said other end and the first level shifter provided at said one end of said plurality of stages of flip-flops is stopped from operating to provide a boosted input signal to the input of a flit-flop at said one end.

27. A shift register as set forth in claim 26, further comprising
   control means for stopping either of the first and the second level shifters, that is rearmost in the shift direction, according to the switching signal.

28. The shift register as set forth in claim 26, wherein each of the first and second level shifters includes a level shift section of a current driving type including an input switching element.

29. The shift register as set forth in claim 28, wherein the control means applies, as an input signal to the level shift section of each of the first and second level shifters, a signal of a level at which the input switching element is cut off, so as to stop the level shifter.

30. The shift register as set forth in claim 27, wherein the control means stops power supply to each of the first and second level shifters so as to stop the level shifter.

31. The shift register as set forth in claim 26, wherein each of the first and second level shifters includes output stabilizing means.

32. An image display device comprising a data signal line driving circuit and a scanning signal line driving circuit, wherein:
  at least either the data signal driving circuit or the scanning signal line driving circuit includes:
    a plurality of stages of flip-flops; and
    a first level shifter provided at one end of said plurality of stages of flip-flops and second level shifters provided at the other end of the plurality of stages of flip-flops, wherein:
      a shift direction is capable of being switched in both directions along said plurality of flip-flops according to a switching signal, and
      in a case where the shift direction is designated so as to be a first direction, an input signal is boosted by the first level shifter provided on a first end of the plurality of stages of flip-flops so as to be applied to an input of a flip-flop at the first end, and
      in a case where the shift direction is designated to be a second direction opposite to the first direction, the input signal is boosted by the second level shifter provided on a second end opposite to the first end of the plurality of stages of flip-flops so as to be applied to an input of a flip-flop at the second end.

33. A two-way shift register, comprising:
  a shift register section for switching an input side end to an output side end or vice versa in accordance with a switching signal, and for transferring an input signal from the end that has become an input-side end to the end that has become an output-side end; and
  level shifters provided respectively adjacent to said ends of said shift register section such that said level shifter adjacent said end that has become an input-side end of said shift register section boosts a received signal and outputs the same as said input signal to an input at said end that has become an input-side end of said shift register section, while said level shifter adjacent to said end that has become an output-side end of said shift register section is stopped from operating to provide a boosted received signal to an input at said end that has become an output-side end of said shift register section.

34. An image display device, comprising:
  a plurality of pixels formed at intersections of a plurality of data signal lines and a plurality of scanning signal lines;
  a data signal line driving circuit for consecutively driving said data signal lines; and
  a scanning signal line driving circuit for consecutively driving said scanning signal lines, wherein:
    at least one of said data signal line driving circuit and said scanning signal line driving circuit includes a shift register circuit, said shift register circuit including:
      a shift register section for switching an input side end to an output side end or vice versa in accordance with a switching signal, and for transferring an input signal from the end that has become an input-side end to the end that has become an output-side end; and
      level shifters provided respectively adjacent to said ends of said shift register section such that said level shifter adjacent said end that has become an input-side end of said shift register section boosts a received signal and outputs the same as said input signal to an input at said end that has become an input-side end of said shift register section, while said level shifter adjacent to said end that has become an output-side end of said shift register section is stopped from operating to provide a boosted received signal to an input at said end that has become an output-side end of said shift register section.

35. An image display device, comprising:
  a plurality of pixels provided at intersections of a plurality of data signal lines and a plurality of scanning signal lines;
  a scanning signal line driving circuit for applying scanning signals to said scanning signal lines one by one, respectively, at different timings in synchronization with a first clock signal having a predetermined frequency; and
  a data signal line driving circuit for extracting data signals to be applied to said pixels along said scanning signal lines to which the scanning signals are applied, from image signals that are consecutively applied in synchronization with a second clock signal having a predetermined frequency and that indicate display states of said pixels, respectively, and for outputting the extracted data signals to said data signal lines, respectively, wherein:
    at least one of the data signal line driving circuit and the scanning signal line driving circuit includes a two-way shift register that utilizes either the first clock signal or the second clock signal as a clock signal, that includes a plurality of flip-flops operating in synchronization with the clock signal, that is capable of switching a shift direction to either of two directions in accordance with a switching signal, and that is supplied with an input signal having an amplitude smaller than that of a driving voltage,
    wherein said two-way shift register further includes level shifters, each said level shifter being provided adjacent to and connected to an input at a different end of said flip-flops such that said level shifter adjacent to the end of said flip-flops supplied with said input signal boosts said input signal and outputs the same as said input signal to said flip-flops, while said level shifter not adjacent to the end of said flip-flops supplied with said input signal is stopped from operating to provide a boosted input signal to an input at the end of said flip-flops adjacent thereto.

36. An image display device, comprising:
  a plurality of pixels provided at intersections of a plurality of data signal lines and a plurality of scanning signal lines;
  a scanning signal line driving circuit for applying scanning signals to said scanning signal lines one by one, respectively, in synchronization with a first clock signal having a predetermined frequency; and
  a data signal line driving circuit for extracting data signals to be applied to said pixels along said scanning signal lines to which the scanning signals are applied, from image signals that are consecutively applied in synchronization with a second clock signal having a predetermined frequency and that indicate display states of said pixels, respectively, and for outputting the extracted data signals to said data signal lines, respectively, wherein:

at least one of the data signal line driving circuit and the scanning signal line driving circuit includes a two-way shift register that utilizes either the first clock signal or the second clock signal as a clock signal, that includes a plurality of flip-flops operating in synchronization with the clock signal, that is capable of switching a shift direction to either of two directions in accordance with a switching signal, and that is supplied with an input signal having an amplitude smaller than that of a driving voltage, and wherein said two-way shift register further includes
level shifters, each said level shifter being provided adjacent to and connected to an input at a different end of said flip-flops such that said level shifter adjacent to the end of said flip-flops supplied with said input signal boosts said input signal and outputs the same as said input signal to said flip-flops, while said level shifter not adjacent to the end of said flip-flops supplied with said input signal is stopped from operating to provide a boosted input signal to an input at the end of said flip-flops adjacent thereto.

* * * * *